(12) United States Patent
Lin et al.

(10) Patent No.: US 6,214,722 B1
(45) Date of Patent: Apr. 10, 2001

(54) METHOD FOR IMPROVING WAFER TOPOGRAPHY TO PROVIDE MORE ACCURATE TRANSFER OF INTERCONNECT PATTERNS

(75) Inventors: Chien-Chih Lin; Bill Hsu; Nien-Tsu Peng, all of Hsinchi Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/286,005

(22) Filed: Apr. 5, 1999

(30) Foreign Application Priority Data

Mar. 15, 1999 (TW) ................................. 88103922

(51) Int. Cl.[7] ............................................... H01L 21/4763
(52) U.S. Cl. ..................... 438/637; 438/598; 438/618; 438/622; 438/631; 430/312
(58) Field of Search ................................. 438/637, 622, 438/778, 598, 618, 631; 430/311, 312

(56) References Cited

U.S. PATENT DOCUMENTS

| | | | |
|---|---|---|---|
| 5,459,340 | * | 10/1995 | Anderson et al. . |
| 5,767,011 | * | 6/1998 | Yao et al. . |
| 5,783,482 | * | 7/1998 | Lee et al. . |
| 5,966,628 | * | 10/1999 | Wei et al. . |
| 5,972,798 | * | 10/1999 | Jang et al. . |

* cited by examiner

Primary Examiner—Charles Bowers
Assistant Examiner—Stephen W. Smoot
(74) Attorney, Agent, or Firm—Jiawei Huang; J.C.Patents

(57) ABSTRACT

A method of manufacturing an interconnect on a wafer having an edge region and an interior region comprises the steps of: forming an insulating layer on the wafer having an interior region and an edge region; forming an opening penetrating through the insulating layer in the interior region and removing a portion of the insulating layer to expose a surface of the wafer in the edge region, simultaneously; forming a conductive layer over the insulating layer and the exposed surface of the wafer and filling the opening; and patterning the conductive layer to form a wire in the opening.

8 Claims, 6 Drawing Sheets

METHOD FOR IMPROVING WAFER TOPOGRAPHY TO PROVIDE MORE ACCURATE TRANSFER OF INTERCONNECT PATTERNS

CROSS-REFERENCE TO RELATED APPLICATION

This application claims the priority benefit of Taiwan application serial no. 88103922, filed Mar. 15, 1999.

BACKGROUND OF THE INVENTION

1. Field of the Invention

The present invention relates to a method of manufacturing a semiconductor device. More particularly, the present invention relates to a method of manufacturing an interconnect.

2. Description of the Related Art

Due to the increasingly high integration of ICs, chips simply cannot provide sufficient area for manufacturing interconnections. Therefore, in accord with the increased interconnect manufacturing requirements of miniaturized MOS transistors, it is increasingly necessary for IC manufacturing to adopt a design with more than two metal layers. In particular, a number of multi-function products, such as microprocessors, may even require 4 or 5 metal layers to complete the internal connections thereof. Generally, an inter-metal dielectric (IMD) layer is used to isolate electrically two adjacent metal layers from each other.

In order to perform an interconnection more easily and to transfer the pattern more precisely, it is important to have a wafer with an even topography. Since the probability of inaccuracy of the alignment system can be reduced by using a wafer with a relatively even topography, the fine pattern can be transferred more accurately.

FIGS. 1A through 1B are schematic, cross-sectional views of the conventional pattern transfer process.

As shown in FIG. 1A, a substrate having a conductive layer 120, wires 120a and 120b and a insulating layer 122 formed thereon is provided. A dotted line I—I divides a wafer (not shown) into two parts. One side of the dotted line I—I, denoted as region 116, is the interior region of the wafer, wherein the interior region has effective dies. The other side of the dotted line I—I, denoted as region 118, is the edge region of the wafer. The dies in the region 118 are incompletely formed, so that the region 118 is a region having ineffective dies. Since the distribution density of the conductive layer 120 is higher than that of the wires 120a and 120b, the ability of portions of the insulating layer 122 in the region 118 to resist the planarization step is higher than that in the region 116. Hence, portions of the insulating layer 122 in the region 118 are thicker than the portions of the insulating layer 122 in the region 116 after chemical-mechanical polishing (CMP). Because the region 118 is higher than the region 116, a sloped surface 124 of the insulating layer 122 above the wire 120a is shown in the region 116 adjacent to the region 118. In highly integrated ICs, the interconnection is more than one layer, so that the step height between the regions 118 and 116 is increasingly larger.

As shown in FIG. 1B, a photoresist 128 is formed on the insulating layer 122. Photolithography is performed to form openings 130a and 130b in the photoresist 128, respectively aligned with the wires 120a and 120b. The opening 130b may be formed to expose the underlying dielectric layer 122 since the photoresist 128 is within the range of depth of focus (DOF). The DOF range is from the optimum focus BF to the maximum AF at both sides of the optimum focus BF. As the portion of the photoresist 128 over the wire 120a is higher and beyond the DOF, so that an error occurs for the photolithography process. As a consequence, the opening 130a fails to expose by the dielectric layer 122. This is called scumming. Additionally, the defocusing happens since a conductive layer subsequently formed on the region 118 is relatively high and beyond the DOF. Therefore, the conductive layer caves.

Generally, the step height of the photoresist caused by the profile of only one conductive layer is about 1000–3000 angstroms, which is an allowable error range. In other words, difference between the photoresist 128 in the region 118 and in the region 116 is about 1000–3000 angstroms. However, the step height increases as the number of the conductive layers increases. Therefore, the step height is more than 6000–7000 angstroms beyond the tolerable range. Hence, the scumming easily happened and it is difficult to accurately transfer a fine pattern from the photomask to the wafer.

SUMMARY OF THE INVENTION

The invention provides a method of manufacturing an interconnect. By using the invention, the problem of scumming can be overcome and the throughput can be greatly enhanced.

To achieve these and other advantages and in accordance with the purpose of the invention, as embodied and broadly described herein, the invention provides a method of manufacturing an interconnect. A wafer having an edge region and an interior region is provided. An insulating layer is formed on the wafer. An opening penetrating through the insulating layer in the interior region is formed and a portion of the insulating layer is removed to expose the surface of the wafer in the edge region, simultaneously. A conductive layer is formed on the insulating layer and the exposed surface of the wafer exposed by the insulating layer and fills the opening. The conductive layer is patterned to form a wire in the opening. Since the insulating layer in the edge region of the wafer is lower than that in the interior region of the wafer and the sloped surface of the insulating layer is in the edge region, a fine pattern can be more accurately transferred from the photomask into the insulating layer. The problem of scumming can be also overcome. Moreover, the throughput can be greatly enhanced by using the invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
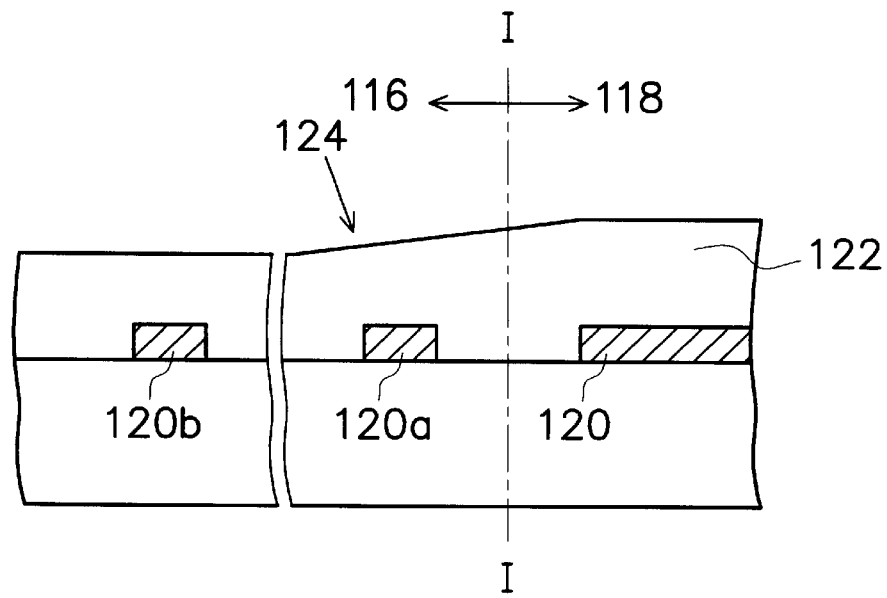
FIGS. 1A through 1B are schematic, cross-sectional views of the conventional pattern transfer process.
Figure 1B:
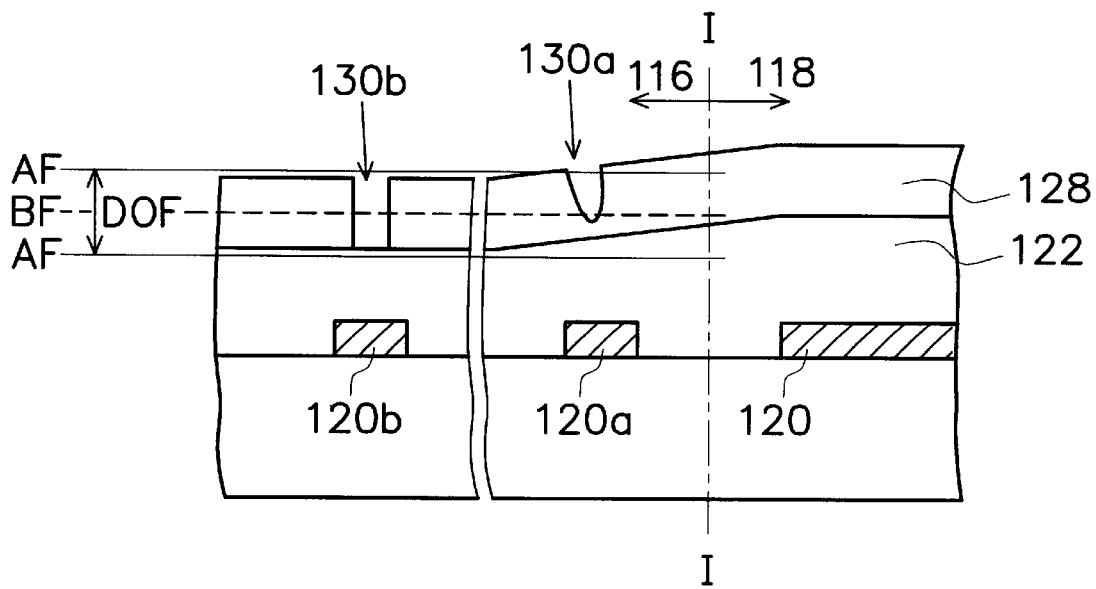

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2L are schematic, cross-sectional views of the process for manufacturing an interconnect in a preferred embodiment according to the invention.

Figure 2A:
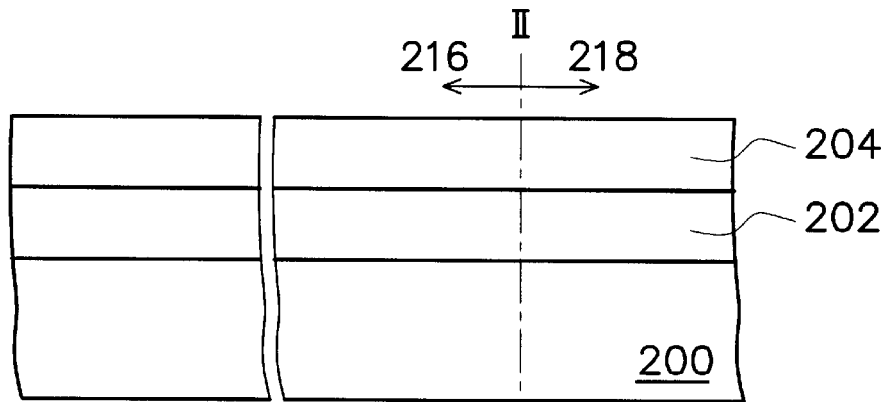
FIGS. 2A through 2L are schematic, cross-sectional views of the process for manufacturing an interconnect in a preferred embodiment according to the invention.

As shown in FIG. 2A, an insulating layer 202 and a photoresist 204 are formed on a substrate 200 in sequence. The insulating layer 202 can be an inter-layer dielectric layer (IDL) or inter-metal dielectric layer (IMD) and the photoresist layer 204 can be a positive photoresist, for example. A dotted line II—II divides a wafer (not shown) into two parts. One side of the dotted line II—II denoted as region 216 is the interior region of the wafer, wherein the interior region has effective dies. The other side of the dotted line II—II denoted as region 218 is the edge region of the wafer. The dies in the region 218 are incomplete, so that the region 218 is a region having ineffective dies.

Figure 2B:
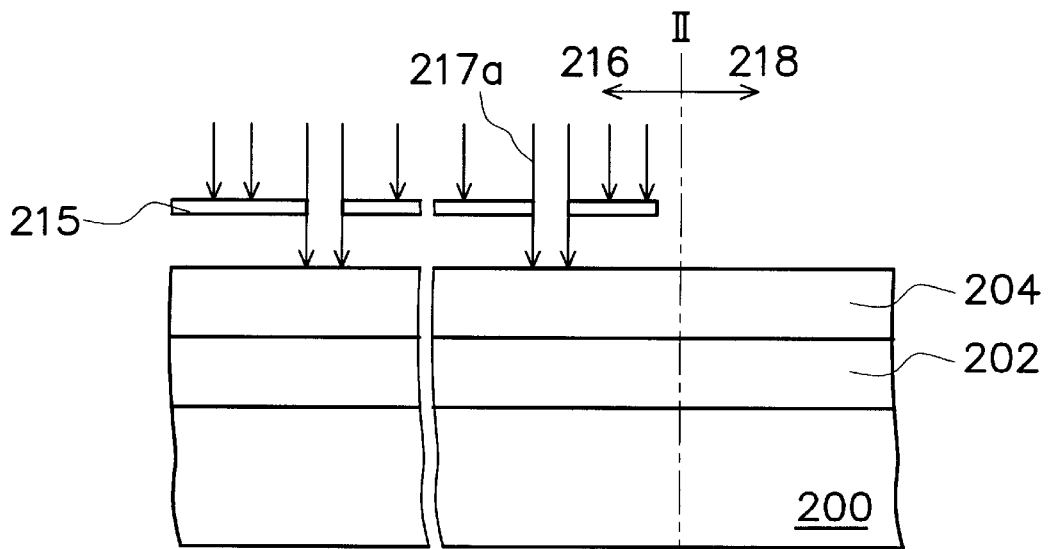

As shown in FIG. 2B, a first exposure step is performed to expose a portion of the photoresist 204 in the region 216 by a light 217a in a stepper with a photomask 215. The pattern is transferred from the photomask 215 into the photoresist 204 through the first exposure step.

Figure 2C:
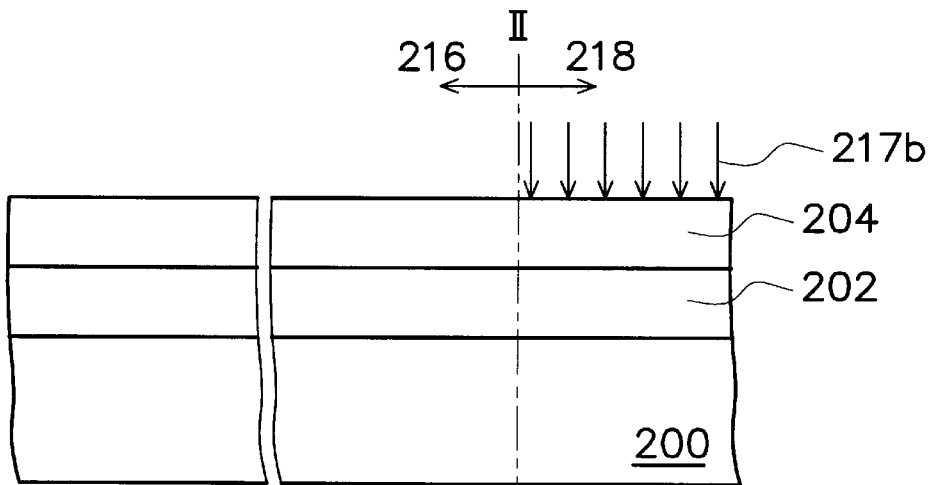

As shown in FIG. 2C, a second exposure step is performed to expose the photoresist 204 in the region 218 by a light 217b in a stepper. In this example, the region 218 can be exposed without using a mask or by using a blank mask. The second exposure step and the first exposure step can be performed in the different steppers, for example.

Figure 2D:
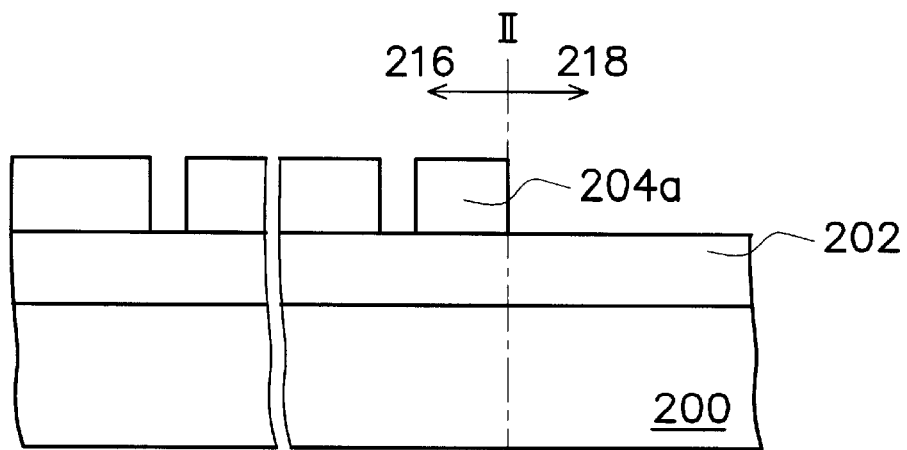

As shown in FIG. 2D, a development step is performed on the photoresist 204 and the pattern on the photomask 215 ( as shown in FIG. 2B) is transferred to the photoresist 204 in the region 216. Therefore, portions of the photoresist 204 in the regions 216 and 218 are removed to expose portions of the insulating layer 202 in the regions 216 and 218 and the patterned photoresist 204 is denoted as photoresist 204a.

Figure 2E:
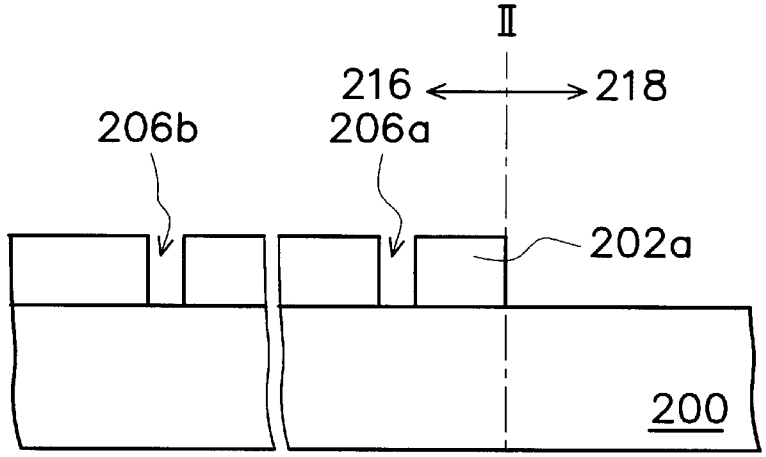

As shown in FIG. 2E, portions of the insulating layer 202 in the region 216 is removed to form openings 206a and 206b by using the photoresist 204a as an etching mask until a portion of the substrate 200 is exposed by the openings 206a and 206b. Simultaneously, the portion of the insulating layer 202 in the region 218 is removed to expose a portion of the substrate 200 in the region 218. The insulating layer 202 having opening 206a and 206b and uncovering the portion of the insulating layer in the region 218 is denoted as insulating layer 202a. The openings 206a and 206b can be via holes or node contact holes, for example. The photoresist 204a is removed to expose the insulating layer 202a.

Figure 2F:
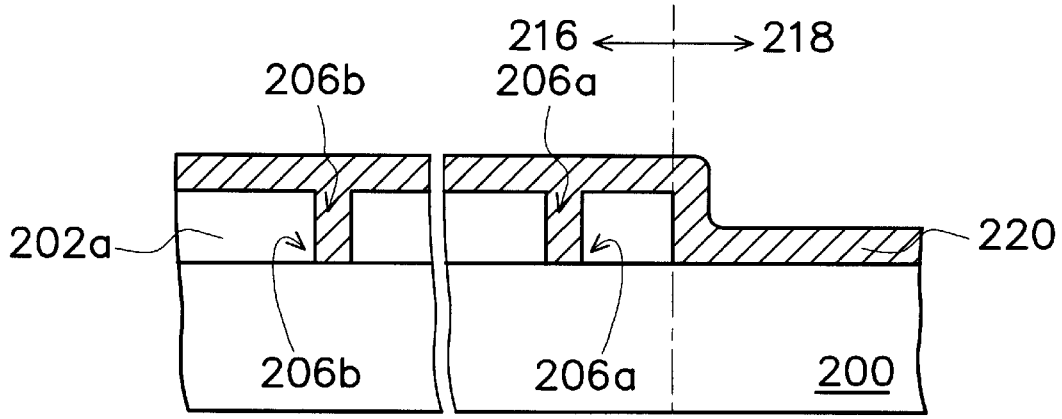

As shown in FIG. 2F, a conductive layer 220 is formed on the substrate 200 exposed by the insulating layer 202a and on the insulating layer 202a and fills the openings 206a and 206b. The material of the conductive layer 220 can be a metal or polysilicon, for example. The thickness of the conductive layer 220 is about 5000 angstroms.

Figure 2G:
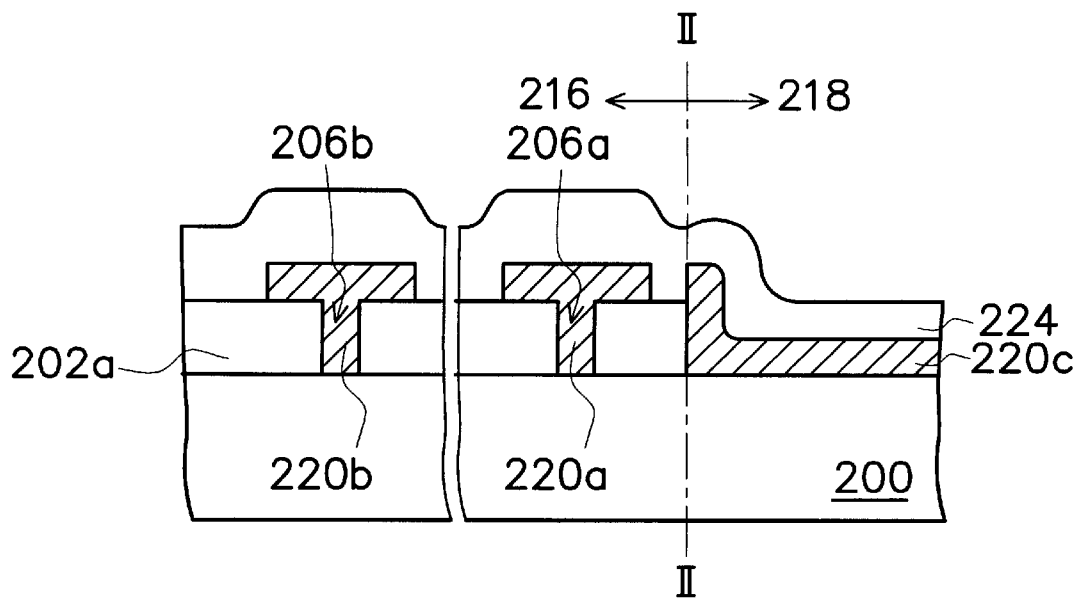

As shown in FIG. 2G, the conductive layer 220 is patterned to form conductive layer 220c, wires 220a and 220b, respectively on the substrate 200 exposed by the insulating layer 202a and in the openings 206a and 206b. An insulating layer 224 with low permittivity is formed over the substrate 200. The insulating layer 224 is formed by chemical vapor deposition, for example. Preferably, the method of forming the insulating layer 224 can be high density plasma chemical vapor deposition (HDPCVD). Since the insulating layer 224 has low permittivity, it can provide good isolation between wires 220a and 220b. Because the wires 220a and 220b are slightly higher than the surface of the insulating layer 202a, the surface of the insulating layer 224 is not smooth.

Figure 2H:
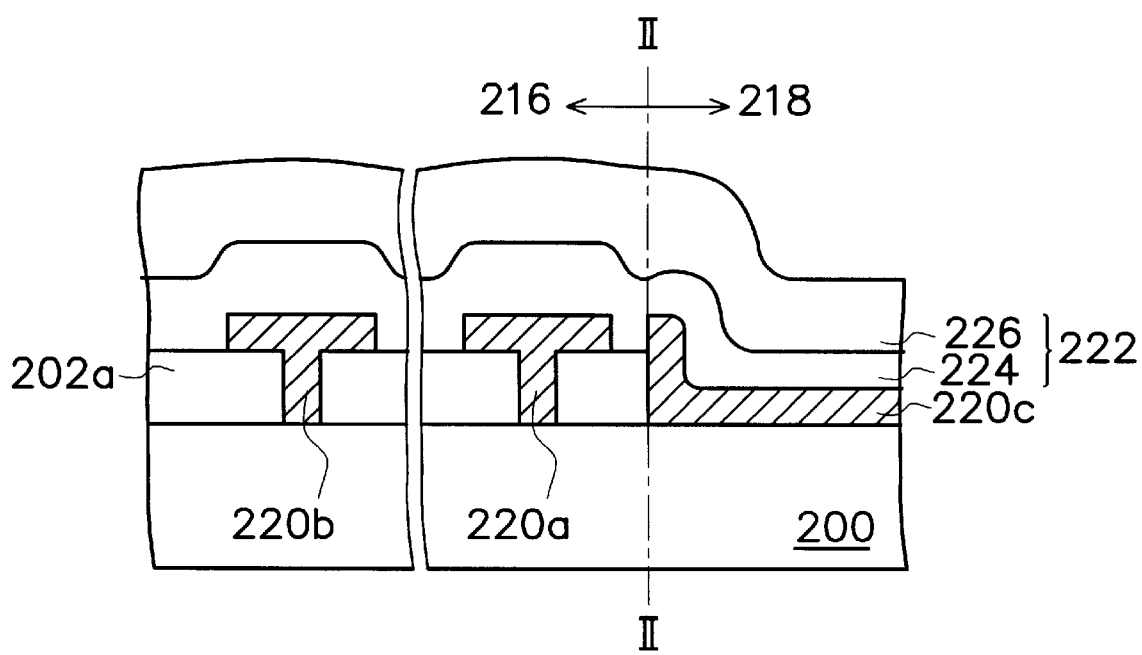

As shown in FIG. 2H, an insulating layer 226 is formed on the insulating layer 224. The insulating layer 226 can be formed by chemical vapor deposition, for example. Preferably, the method of forming the insulating layer 226 can be plasma enhancement chemical vapor deposition (PECVD). The insulating layers 224 and 226 together form an insulating layer 222. Since the portion of the insulating layer 224 above the wires 220a and 220b are relatively thick, the topography of the insulating layer 224 is rough. Therefore, the topography of the insulating layer 226 formed on the insulating layer 224 is uneven.

Figure 2I:
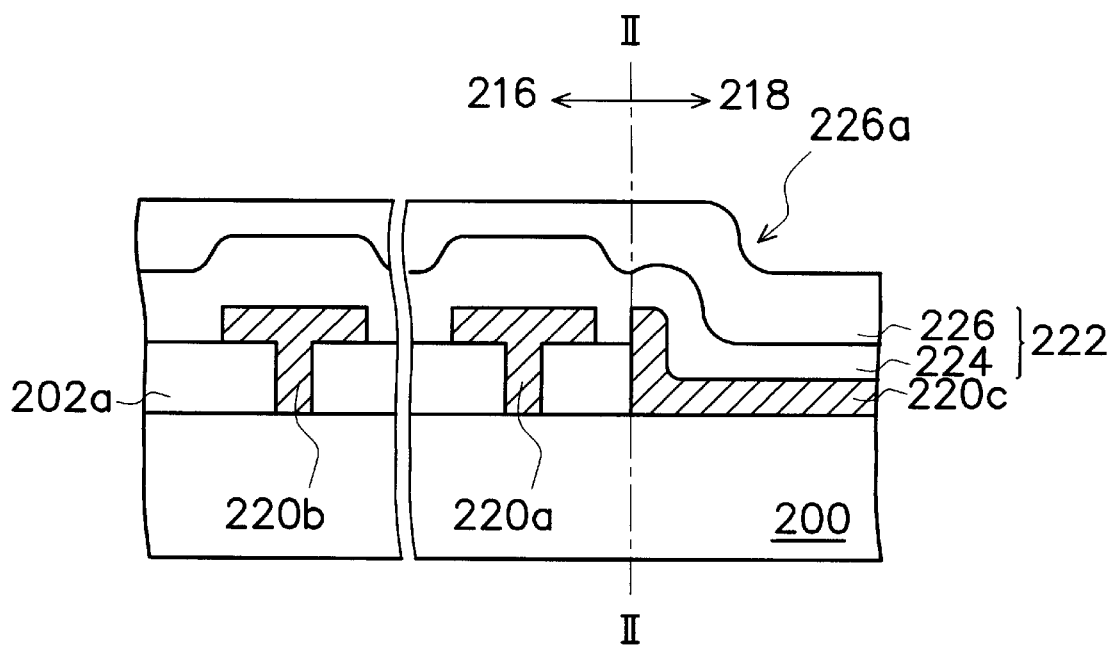

As shown in FIG. 2I, a planarization step is performed to planarize the insulating layer 226. The planarization step can be CMP. Since the region 218 is lower than the region 216, the region 218 is slightly lower than the region 216 after the planarization step. Hence, a sloped surface 226a of the insulating layer 222 is shown in the regions 218 adjacent to the region 216. In the other words, the portion of the insulating layer 226 above the wires 220a and 220b is very even.

Figure 2J:
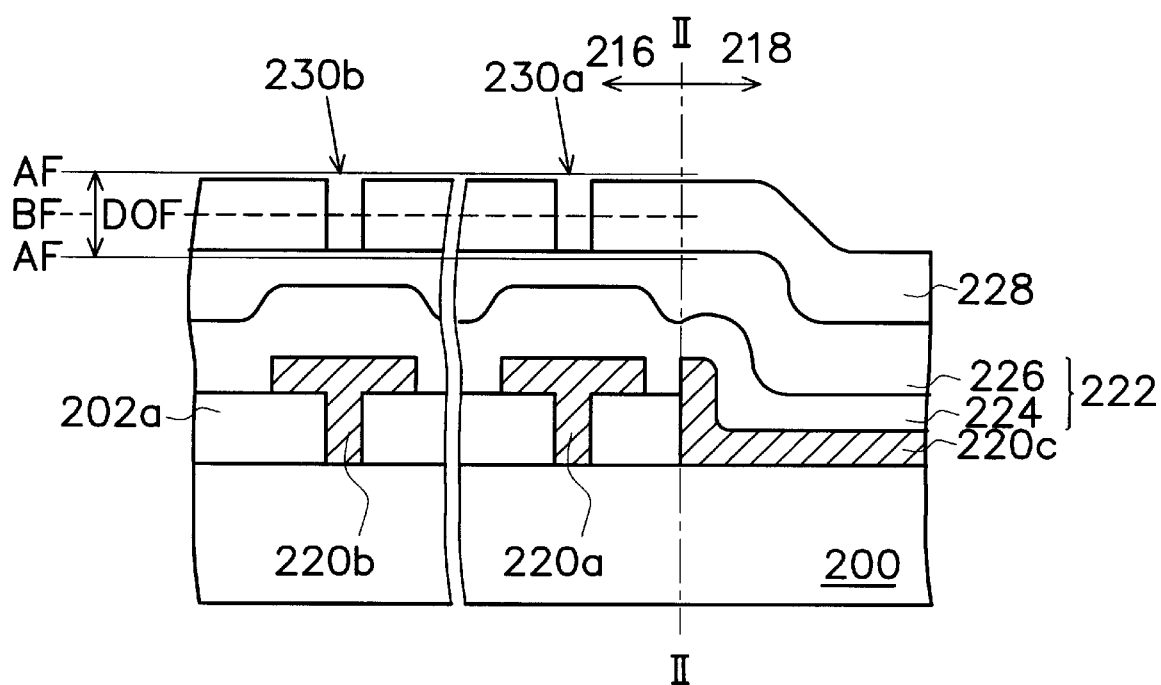

As shown in FIG. 2J, a patterned photoresist 228 having openings 230a and 230b is formed on the insulating layer 222. The openings 230a and 230b are respectively aligned with the wires 220a and 220b. Because of the very even insulating layer 226 above the wires 220a and 220b, a portion of the photoresist 228 above the wires 220a and 220b is within the DOF range and the scumming will not happen. Hence, the openings 230a and 230b are vertical to the insulating layer 222 and expose a portion of the insulating layer 222 above the wires 220a and 220b.

Figure 2K:
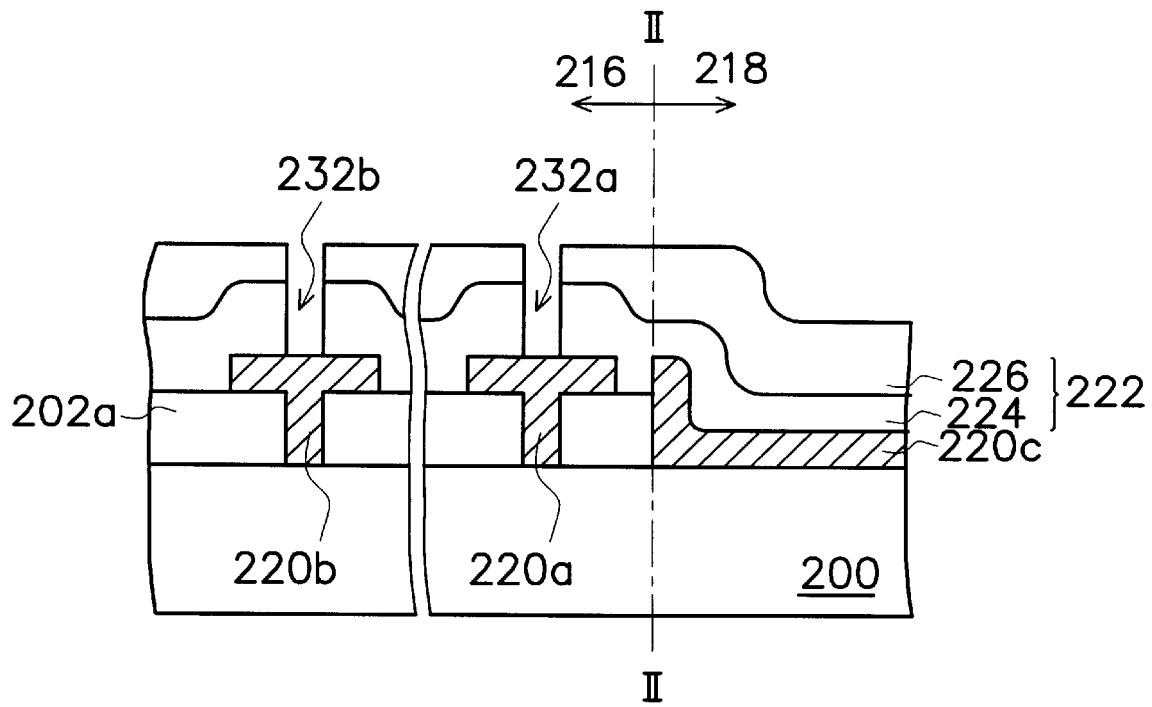

As shown in FIG. 2K, a portion of the insulating layer 222 is removed to form openings 232a and 232b by using the patterned photoresist 228 as an etching mask. The openings 232a and 232b penetrate through the insulating layer 222 and respectively expose the wires 220a and 220b. The openings 232a and 232b can be via holes or node contact holes, for example. The patterned photoresist 228 is removed.

Figure 2L:
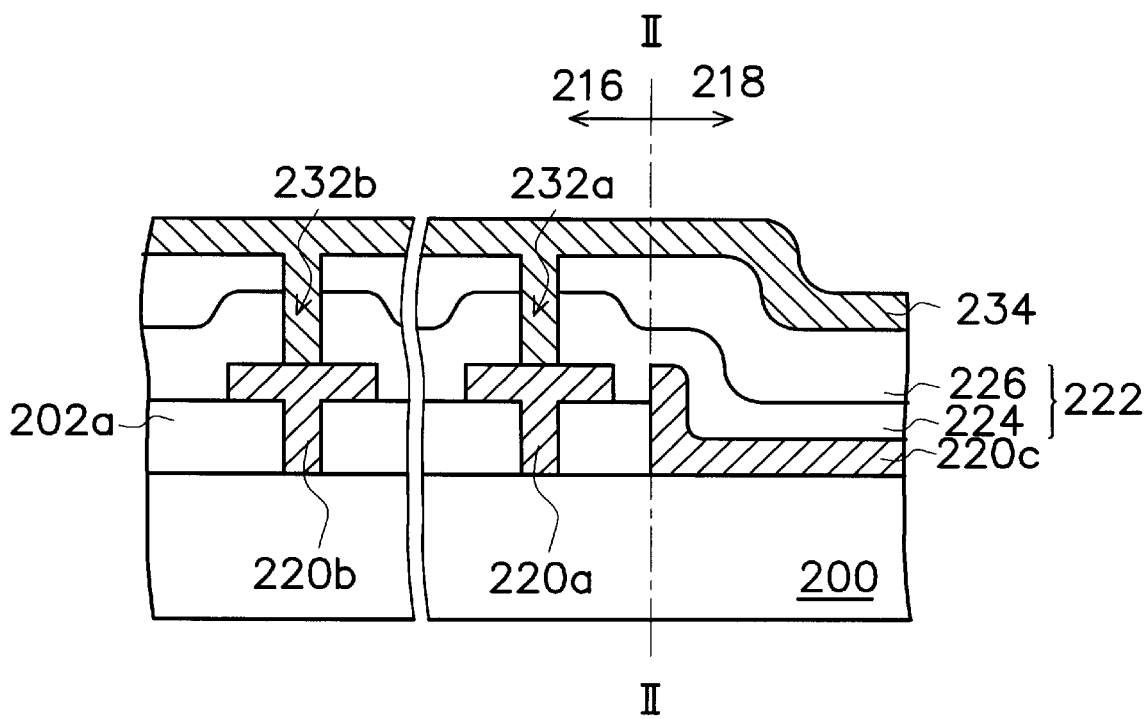

As shown in FIG. 2L, a conductive layer 234 is formed on the insulating layer 222 and fills the openings 232a and 232b.

In the invention, when other interconnection layers are formed on the conductive layer 234, the process of forming the interconnection layers is the same as the process shown from FIGS. 2A through 2L. In the other words, a portion of the insulating layers above the conductive layer 234 in the region 218 is removed, which is the same as the formation of the insulating layer 202a. In this example, the method of removing a portion of the insulating layer in the region 218 can be used for alternating insulating layers.

In the invention, since the edge region of the wafer is lower than the interior region of the wafer and the sloped surface of the insulating layer and the photoresist is in the edge region, the insulating layer in the edge region is in the DOF range. Therefore, a fine pattern can be transferred from the photomask into the insulating layer more accurately and the problem of scumming is overcome. Moreover, the loss ratio of effective dies in the interior region of the wafer by using the conventional method is about 15 percent. However, by using the invention, the throughput can be greatly enhanced by about 20 percent.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an interconnect on a wafer, wherein the wafer has an edge region and an interior region, the method comprising the steps of:

forming an insulating layer on the wafer having an interior region and an edge region;

forming an opening penetrating through the insulating layer in the interior region and removing a portion of the insulating layer to expose a surface of the wafer in the edge region, simultaneously;

forming a conductive layer over the insulating layer and the exposed surface of the wafer and filling the opening; and patterning the conductive layer to form a wire in the opening.

2. The method of claim 1, wherein the opening includes a via hole.

3. The method of claim 1, wherein the opening includes a node contact hole.

4. The method of claim 1, wherein the step of forming the opening and removing the portion of the insulting layer comprises the steps of:

forming a positive photoresist on the insulating layer;

performing a first exposure step to form a first exposure region in the positive photoresist above the subsequent formed opening;

performing a second exposure step to form a second exposure region in the positive photoresist in the edge region;

removing the first and the second exposure regions until portions of the insulating layer are exposed;

removing a portion of the insulating layer exposed by the positive photoresist to form the opening and to expose the edge region of the wafer; and removing the remaining positive photoresist.

5. The method of claim 4, wherein the first and the second exposure steps are performed in different steppers.

6. The method of claim 4, wherein the second exposure step is performed without using any mask.

7. The method of claim 4, wherein the second exposure step is performed by using a blank mask.

8. The method of claim 1, wherein a material of the conductive layer can be polysilicon.

* * * * *